(12) United States Patent
Gvishi

(10) Patent No.: US 8,969,219 B2
(45) Date of Patent: Mar. 3, 2015

(54) UV-CURABLE INORGANIC-ORGANIC HYBRID RESIN AND METHOD FOR PREPARATION THEREOF

(75) Inventor: Raz Gvishi, Gedera (IL)

(73) Assignee: Soreq Nuclear Research Center, Yavne (IL)

( * ) Notice: Subject to any disclaimer, the term of this patent is extended or adjusted under 35 U.S.C. 154(b) by 528 days.

(21) Appl. No.: 13/132,635

(22) PCT Filed: Dec. 3, 2009

(86) PCT No.: PCT/IL2009/001138
§ 371 (c)(1),
(2), (4) Date: Jun. 3, 2011

(87) PCT Pub. No.: WO2010/064240
PCT Pub. Date: Jun. 10, 2010

(65) Prior Publication Data
US 2011/0244695 A1    Oct. 6, 2011

Related U.S. Application Data

(60) Provisional application No. 61/119,459, filed on Dec. 3, 2008.

(51) Int. Cl.
| | | |
|---|---|---|
| H01L 21/31 | (2006.01) |
| H01L 21/469 | (2006.01) |
| H01L 23/29 | (2006.01) |
| C08G 77/58 | (2006.01) |
| G02B 1/04 | (2006.01) |
| G03F 7/00 | (2006.01) |
| G03F 7/004 | (2006.01) |
| G03F 7/038 | (2006.01) |
| G03F 7/075 | (2006.01) |

(52) U.S. Cl.
CPC ...... *C08G 77/58* (2013.01); *G02B 1/04* (2013.01); *G03F 7/0037* (2013.01); *G03F 7/0043* (2013.01); *G03F 7/0388* (2013.01); *G03F 7/0757* (2013.01); *H01L 23/296* (2013.01)
USPC ........... 438/780; 438/781; 438/789; 438/790; 257/791; 257/792; 522/71; 528/32; 523/443

(58) Field of Classification Search
USPC ............ 534/550, 553, 588; 522/71, 83, 522/109–113; 528/32, 34, 354, 361; 430/270.1, 280.1, 281.1, 286.1; 523/1, 523/443, 440; 257/687, 702, 709, 791, 792, 257/E21.242, E21.259, E21.6; 438/125, 438/795, 780, 781, 789, 790
See application file for complete search history.

(56) References Cited

U.S. PATENT DOCUMENTS

| | | | |
|---|---|---|---|
| 7,687,654 B2 * | 3/2010 | Frohlich et al. ............... | 556/466 |
| 2002/0165339 A1 | 11/2002 | Zha et al. | |
| 2004/0242830 A1 * | 12/2004 | Frohlich et al. ................. | 528/32 |
| 2005/0101698 A1 | 5/2005 | Harada et al. | |
| 2008/0085985 A1 * | 4/2008 | Nakamura et al. .............. | 528/25 |
| 2010/0104879 A1 * | 4/2010 | Okano .......................... | 428/447 |

OTHER PUBLICATIONS

Gvishi, et al., "Optical waveguide fabrication using a fast-sol-gel method" Optical Materials, vol. 30, pp. 1755-1758, (2008).

* cited by examiner

*Primary Examiner* — Hsien Ming Lee
(74) *Attorney, Agent, or Firm* — Browdy and Neimark, PLLC

(57) ABSTRACT

The present invention relates to a method for preparation of an ultraviolet (UV)-curable inorganic-organic hybrid resin containing about or less than 4% volatiles and less than 30% organic residues. The UV-curable inorganic-organic hybrid resin obtained according to this method can be UV-cured within a markedly very short time and enables, upon curing, the formation of a transparent shrink-and crack-free glass-like product having high optical quality, high thermal stability and good bonding properties. In view of these properties, this hybrid resin can be used in various applications such as electro-optic, microelectronic, stereolithography and biophotonic applications.

44 Claims, 4 Drawing Sheets (a) Silicone rubber (b) Fast sol-gel – Organic/Inorganic Hybrid (c) Silica glass (a) Silicone rubber    (b) Fast sol-gel – Organic/Inorganic Hybrid    (c) Silica glass

UV-CURABLE INORGANIC-ORGANIC HYBRID RESIN AND METHOD FOR PREPARATION THEREOF

TECHNICAL FIELD

The present invention relates to a method for preparation of an ultraviolet (UV)-curable inorganic-organic hybrid resin containing about or less than 4% volatiles and less than 30% organic residues. This hybrid resin enables, upon curing, the formation of a transparent glass-like product and thus can be used in various applications.

BACKGROUND ART

The sol-gel method is a well known process for preparing silica-like materials at low temperatures (25-80° C.), generally consisting of sol preparation, gelling the sol in a mold, drying, firing and sintering (Klein, 1988 and 1993; Hench and West, 1990). This process is implemented in various applications such as fabrication of optical elements and protective and functional coatings, ceramic powders, fabrication of optical fibers, matrices for cosmetic products and insulation. Traditional sol-gel process involves the chemistry of metal alkoxides precursors such as silicon alkoxides and similar metals alkoxides such as titanium, aluminum and zirconium, resulting in amorphous inorganic materials. A technique growing in use is fabrication of inorganic-organic hybrid sol-gel using organically modified alkoxides as precursors. These hybrid products are commonly known as organically modified silicates (ORMOSILs).

One of the drawbacks of sol-gel products prepared by the conventional sol-gel process, i.e., using the traditional alkoxides as precursors, is the formation of cracks that limits the achievable bulk size to a few centimeters, or the achievable film thickness to less than 1 μm (Dislich, 1988). In order to overcome these limitations, the introduction of an organic polymer into the sol-gel matrix was suggested (Schmidt, 1989) to thereby generate an inorganic-organic hybrid. The basic precursors for fabrication of an inorganic-organic hybrid are the organically modified alkoxides developed by Schmidt (Schmidt, 1984), i.e., alkoxides in which at least one alkoxyl group is substituted by an organic tail, which releases stress and gives the sol-gel product additional flexibility, thus allowing the material to withstand the capillary forces during the formation process and enabling the formation of large bulks or thick films (tens to hundreds μm). Various organically modified alkoxides such as methyltrimethoxysilane (MTMS), dimethoxydimethylsilane (DMDMS), methacrylatepropyltrimethoxy-silane (MATMS) and 3-glycidoxypropyltrimethoxy-silane (GLYMO) are used as precursors for the preparation of inorganic-organic hybrids (Altman et al., 1991; Pellice et al., 2006). However, in cases the majority of the precursors are inorganic alkoxides as to obtain a glass-like material, a very slow and long drying process, at up to about 600° C., is required; and in cases the majority of the precursors are organically modified alkoxides, e.g., in organic modified ceramics (ORMOCERs) (Haas et al., 1999a-b), a more organic-like polymer, i.e., a polymer containing more than 50% organic residues, is obtained. The latter suffers from the well known limitations of organic polymers, which are (i) lower transparency compared to glass; (ii) higher absorption in the UV region; (iii) larger dispersion, i.e., change in refractive index as a function of wavelength; (iv) larger thermal expansion coefficient; and (v) a larger thermo-optic coefficient (temperature dependence of the refractive index, dn/dT).

In order to accelerate the sol-gel process while still producing a crack-free product, a method for controlling the evaporation rate was introduced by Haruvy (Haruvy et al., 1992). This method, known as the fast sol-gel method, consists of semi-supercritical drying, in which the evacuation of volatile solvents is done under controlled temperature and pressure conditions. The fast sol-gel manufacturing process is very rapid (~few minutes) and leads to a viscous sol-gel resin containing 10%-40% organic residues, combining in this way some of the advantages of organic polymers such as negligible cracks-formation and shrinkage during the process with the advantages of silica such as improved thermal stability (Gutina et al., 1999). The curing however of this resin takes usually several hours or more (Gvishi, 2009).

SUMMARY OF INVENTION

It has been found, in accordance with the present invention, that by a certain method of preparation, using a combination of traditional silicon alkoxides and organically modified silicon alkoxides precursors, UV-curable inorganic-organic hybrid resins containing very low content of volatiles and low content of organic residues can be obtained. In contrast to the UV-curable hybrid resins currently known, the hybrid resins obtained by this method enable, upon curing, the formation of a transparent shrink- and crack-free glass-like product having high optical quality, high thermal stability and good bonding properties. In contrast to the non UV-curable sol-gel resins, the hybrid resins obtained by this method can be UV-cured within a markedly very short time.

In one aspect, the present invention thus relates to a method for preparation of a UV-curable inorganic-organic hybrid resin containing about or less than 4% volatiles and less than 30% organic residues, said method comprising the steps:

(i) providing (a) a first monomer or first mixture of monomers, wherein each one of said monomers is a metal alkoxide; (b) a second monomer or second mixture of monomers, wherein each one of said monomers is a metal alkoxide in which at least one but not all the alkoxyl groups is substituted by a non-polymerizable group; and (c) a third monomer or third mixture of monomers, wherein each one of said monomers is a metal alkoxide in which at least one but not all the alkoxyl groups is substituted by a non-hydrolyzable polymerizable group;

(ii) performing hydrolysis and poly-condensation of said monomers or mixtures of monomers of (a), (b) and (c) in the presence of water and an hydrolysis catalyst, in a closed system, at an elevated temperature and pressure, to thereby release an alcohol that serves as a common solvent, while said temperature is kept above the boiling point of said alcohol and below the boiling point of said monomers, and vapors of said solvent and the water are removed, thus keeping a constant pressure; and (iii) reducing the pressure in said system below atmospheric pressure, thus evacuating remaining vapors of said solvent and the water to thereby obtain an inorganic-organic hybrid resin, wherein either:

a photo-initiator is added to one of the monomers or mixtures of monomers in step (i) or to the water in step (ii) to thereby obtain, following step (iii), the UV-curable inorganic-organic hybrid resin; or the inorganic-organic hybrid resin obtained in step (iii) is dissolved in a solution comprising a solvent capable of preventing polymerization and a photo-initiator, and optionally subsequently filtered, to thereby obtain a solution of the UV-curable inorganic-organic hybrid resin capable of long-term storage without polymerizing.

In another aspect, the present invention provides a UV-curable inorganic-organic hybrid resin that enables, upon curing, the formation of a transparent glass-like product containing about or less than 4% volatiles and less than 30% organic residues. In one embodiment, the glass-like product formed has (i) an optical loss lower than 0.1 dB/cm, preferably lower than 0.01 dB/cm, more preferably lower than 0.001 dB/cm, in the visible region; (ii) an adhesive strength for glass to glass bonding of at least 7 MPa, preferably at least 9 MPa, more preferably at least 10 MPa; and (iii) a thermal stability greater than 200° C., preferably greater than 275° C., more preferably greater than 350° C.

The UV-curable inorganic-organic hybrid resin of the present invention can be used in various applications as described hereinafter.

MODES FOR CARRYING OUT THE INVENTION

In one aspect, the present invention relates to a novel method for preparation of a UV-curable inorganic-organic hybrid resin containing about or less than 4% volatiles and less than 30% organic residues, as defined above. In one embodiment, the UV-curable inorganic-organic hybrid resin prepared according to this method contains less than 3%, preferably less than 2%, more preferably less than 1% volatiles, and less than 25%, preferably less than 20%, more preferably less than 15%, most preferably less than 10%, organic residues.

The term "UV" as used herein is an abbreviation for ultraviolet radiation.

Figure 1:
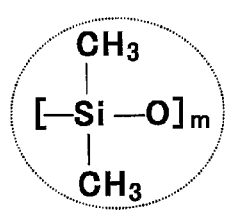
FIG. 1 illustrates the basic structure of the inorganic-organic hybrid resin produced according to the method of the present invention, which may vary between a silicone rubber and a silica glass. In particular, (a) represents a silicone rubber, i.e., a linear chain material having flexible properties; (b) represents a fast sol-gel material, i.e., an organic-inorganic hybrid being an intermediate between a silicone rubber and a silica glass, having properties that can be custom designed; and (c) represents a silica glass, i.e., a hard and brittle material.
Figure 1:
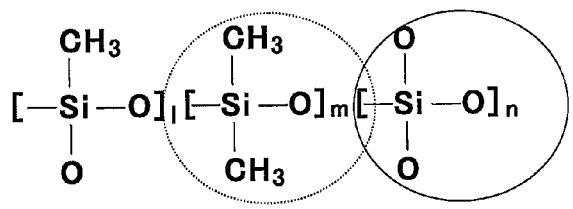
Figure 1:
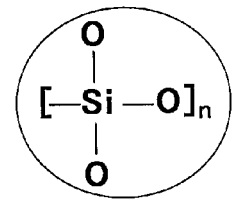

The method of the present invention uses traditional alkoxides in combination with organically modified alkoxides as precursors, to produce an inorganic-organic hybrid resin, i.e., a sol-gel material, having properties that vary between silicone rubbers and silica glass, as demonstrated in FIG. 1. In particular, in order to prepare a UV-curable inorganic-organic hybrid resin according to this method, three types of polymerisable monomers or mixtures of monomers are used. The first type of monomers is a metal alkoxide that forms the silica skeleton or any other relevant metal oxide skeleton. The second type of monomers is a metal alkoxide in which at least one but not all the alkoxyl groups is substituted by a non-polymerizable group that provides the flexibility of the structure that avoids cracks. The third type of monomers is a metal alkoxide in which at least one but not all the alkoxyl groups is substituted by a non-hydrolyzable polymerizable group. The latter is a UV-curable polymerisable monomer, which increases cross-linkage and enable the UV-curing of the final product.

The term "metal alkoxide" as used herein refers to a metalorganic compound in which alkoxyl groups, i.e., conjugate bases of alcohols, are linked via their negatively charged oxygen atoms to a ion of a metal or metalloid atom having a valence of three or four.

The metal alkoxide that can be used according to the present invention is an alkoxide of any metal having a valence of three or four, preferably selected from a transition metal such as Ti, V, Y or Zr, a lanthanide metal such as Ce, Pr, Nd, Pm, Sm, Eu, Gd, Tb, Dy, Ho, Er, Tm, Yb or Lu, Al, or such as an element as Si or B, and a $C_1$-$C_{10}$ straight or branched alkanol including, without being limited to, methanol, ethanol, propanol, isopropanol, n-butanol, isobutanol, sec-butanol, tert-butanol, an amyl alcohol such as 1-pentanol, 2-pentanol, 3-pentanol, 2-methyl-1-butanol, 3-methyl-1-butanol, 2-methyl-2-butanol, 3-methyl-2-butanol and 2,2-dimethyl-1-propanol (neopentanol), a hexanol such as 1-hexanol, 2-hexanol, 3-hexanol, 2-methyl-1-pentanol, 3-methyl-1-pentanol, 4-methyl-1-pentanol, 2-methyl-2-pentanol, 3-methyl-2-pentanol, 4-methyl-2-pentanol, 2-methyl-3-pentanol, 3-methyl-3-pentanol, 2,2-dimethyl-1-butanol, 2,3-dimethyl-1-butanol, 3,3-dimethyl-1-butanol, 2,3-dimethyl-2-butanol, 3,3-dimethyl-2-butanol and 2-ethyl-1-butanol, 1-heptanol, 1-octanol, 1-nonanol, 1-decanol, and the like. In a preferred embodiment, the metal alkoxide is an alkoxide of Si, Ti, Zr or B, more preferably Si, and a $C_1$-$C_6$, more preferably a $C_1$-$C_2$, straight alkanol.

The non-polymerizable group according to the present invention may be either a hydrogen. atom or a $C_1$-$C_{10}$, preferably $C_1$-$C_6$, more preferably $C_1$-$C_2$, straight or branched alkyl including, without being limited to, methyl, ethyl, propyl, isopropyl, butyl, isobutyl, sec-butyl, tert-butyl, pentyl, neopentyl, sec-pentyl, hexyl, heptyl, octyl, nonyl, decyl and the like.

The non-hydrolyzable polymerizable group according to the present invention may be an acrylate such as a methacrylate, preferably propylmethacrylate, an epoxide such as glycidyoxypropyl, a vinyl group such as vinyl silane, also known as ethenyl silane, vinyltriethoxysilane and vinyltriisopropoxysilane, or a styrene group such as styrlethyltrimethoxysilane.

In preferred embodiments, the metal alkoxide is tetramethoxysilane (TMOS), tetraethoxysilane (TEOS), tetraethylorthotianate (TEOT), tetrabutylorthotitanate (TBOT), zirconium tetrapropoxide (TPOZ), zirconium tetraethoxide (TEOZ), aluminum triethoxide (TEOA) or trimethoxyborane (TMOB), most preferably TMOS; the metal alkoxide in which at least one but not all the alkoxyl groups is substituted by a non-polymerizable group is methyltrimethoxysilane (MTMS) or dimethyldimethoxysilane (DMDMS); and the metal alkoxide in which at least one but not all the alkoxyl groups is substituted by a non-hydrolyzable polymerizable group is 3-trimethoxysilylpropylmethacrylate (MATMS or MPTMA), 3-glycidyoxpropyltimethoxysilane (GLYMO or GPTS) or vinyl silane.

According to the method of the present invention, the hydrolysis and poly-condensation step is carried out by adding water and a hydrolysis catalyst only, i.e., no pre-hydrolysis step is required and no common solvent is provided. In fact, since the reaction is carried out in a closed system, the alcohol formed and released in situ as a result of the hydrolysis process is caged in the system and therefore stays in the reaction mixture as the common solvent.

The alcohol formed during the hydrolysis and poly-condensation step is derived from the specific alkoxyl groups of the three types of inorganic polymerisable monomers used in the reaction. Accordingly, the alcohol formed may consist of a sole alcohol such as methanol, ethanol, propanol and the like, or a mixture of different alcohols such as, without being limited to, a mixture of methanol and ethanol. In preferred embodiments, the alcohol formed during the hydrolysis and poly-condensation step is methanol, ethanol or a mixture thereof, more preferably, methanol.

The hydrolysis and poly-condensation reactions are carried out at a working temperature that is above the boiling point of the alcohol released and below the boiling point of each one of the monomers used as precursors in the process. For example, in case the alcohol formed consists solely of methanol, the minimal temperature in which the reaction may be performed is 65° C., i.e., above the boiling point of methanol, and in case the alcohol formed consists solely of ethanol, the minimal temperature in which the reaction may be performed is about 80° C., i.e., above the boiling point of ethanol.

The alcohol formed and released generates vapor, which increases the pressure within the closed system. For example, in case methanol is formed and the reaction is carried out at about 100° C., the pressure created is equal to about 3.5 atmospheres. According to the method of the present invention, vapors of the alcohol and of the water are continuously removed above a given pressure, and the pressure inside the system is thus kept constant. In case methanol is formed during the hydrolysis and poly-condensation process, the preferred pressure for the reaction is in the range of 2.5-3.5 atmospheres.

The hydrolysis and poly-condensation reactions occur at about the same time and are completed in a very short time, usually in about a few minutes. As stated above, the pressure created during these reactions is kept at a certain level, namely, volatile solvents, i.e., alcohol and water vapors, are continuously released from the system. According to step (iii) of the method of the present invention, at about the end of the hydrolysis and poly-condensation reactions, the pressure in the reaction system is gradually reduced, first to atmospheric pressure and then below atmospheric pressure using, e.g., an evacuation pump, leading to evacuation of the remaining alcohol and water vapors. Consequently, monomer molecules that have not yet reacted, if present, are hydrolyzed and condensed, and an inorganic-organic hybrid resin before gelation is obtained. In a preferred embodiment, the temperature during most of the hydrolysis and poly-condensation step is kept under the boiling temperature of water, i.e., vapors of the water are released, in fact, only when the pressure in the system is reduced below atmospheric pressure in step (iii).

As defined above, the inorganic-organic hybrid resin obtained in step (iii) is a viscous resin containing about or less than 4% volatiles and less than 30%, preferably less than 25%, more preferably less than 20%, most preferably less than 15%, still most preferably less than 10%, organic residues. This inorganic-organic hybrid resin enables, upon curing, the formation of a transparent sol-gel material, having optical and physical properties such as refractive index and thermal expansion that can be engineered by controlling the ratio between the various precursors used in the process. Sol-gel materials with high refractive indices (>1.458) may be obtained by manufacturing a silica skeleton with higher refractive index additives such as metal oxides, e.g., alumina, titania and zirconia, or a monomer with high cross-linking organic polymeric group such as MATMS and GLYMO, wherein the increase in the refractive index is a linear function of the additives' concentration; and sol-gel materials with low refractive indices can be obtained by controlling the amount of porosity in the matrix.

In one embodiment, the weight ratio between the first type of monomers, i.e., the first monomer or first mixture of monomers, the second type of monomers, i.e., the second monomer or second mixture of monomers, and the third type of monomers, i.e., the third monomer or third mixture of monomers, is in the range of 10-50:50-90:up to 20, respectively. In a preferred embodiment, the weight ratio between the three types of monomers is in a range of 20 to 50:50 to 75:up to 10, respectively. In a more preferred embodiment, the weight ratio between the three types of monomers is in a range of 30 to 45:50 to 65:up to 5, respectively. In cases one or more types of monomers is, in fact, a mixture of different monomers, the ratio between the weight of each one of the monomers in each mixture may vary and therefore affect the properties of the sol-gel material eventually obtained.

Unless otherwise indicated, all numbers expressing quantities or concentrations of ingredients, reaction conditions, and so forth used in this specification are to be understood as being modified in all instances by the term "about". Accordingly, unless indicated to the contrary, the numerical parameters set forth in this specification are approximations that may vary by up to plus or minus 10% depending upon the desired properties to be obtained by the present invention.

An additional parameter that may influence the optical and physical properties of the inorganic-organic hybrid resin obtained is the molar ratio between the total amounts of the monomers used as precursors, i.e., the first, second and third types of monomers or mixtures of monomers, and of the water added to the reaction system. In general, this ratio is determined as required so as to complete the reaction, although it is preferred to provide only about 90% of the water required for completion of the reaction. In a preferred embodiment, the molar ratio between the total amount of the three types of monomers and the amount of the water is in the range of 1:1.5-2.5, more preferably 1:1.8-2, respectively.

In one embodiment, the first monomer used as a precursor in the method of the present invention is TMOS, the second monomer used as a precursor is MTMS, and the third monomer used as a precursor is MATMS. In preferred embodiments shown in Example 1 hereinafter, herein identified hybrid resins N-2, N-3 and N-4, the weight ratio between the first monomer, the second monomer, the third monomer and the water is about 3:15:2:3.85, 3:14:3:3.85 and 3:13:4:3.85, respectively, the alcohol released during step (ii) is methanol, and the temperature is kept above 65° C. and below 102° C., resulting in formation of vapors of the methanol and the water and in increased pressure. Above a pressure of about 2.5-3.5 atm, the vapors are removed, thus keeping a constant pressure. The inorganic-organic hybrid resin obtained in step (iii) has a weight that is less than 60%, preferably in a range of 47-53%, of the total weight of the monomers provided in step (i). In other preferred embodiments described in Example 3 (i)-(iv), the weight ratio between the TMOS, MTMS, MATMS and the water is about 3:14:3:3.85, 3:16:1:3.85, 5:13:2:3.85 or 6:9:2:3.85, respectively.

In another embodiment, the first monomer used is TMOS, the second monomer used is MTMS, and the third monomer used is GLYMO. In a preferred embodiment shown in Example 2, herein identified hybrid resin E-2, the weight ratio between the first monomer, the second monomer, the third monomer and the water is about 3:15:2:3.85, respectively, the alcohol released during step (ii) is methanol, and the temperature is kept above 65° C. and below 102° C., resulting in formation of vapors of the methanol and the water and in increased pressure. Above a pressure of about 2.5-3.5 atm, the vapors are removed, thus keeping a constant pressure. The inorganic-organic hybrid resin obtained in step (iii) has a weight that is less than 60%, preferably in a range of 47-53%, of the total weight of the monomers provided in step (i).

In a further embodiment, the first monomer used is TMOS, the second mixture of monomers used is a mixture of MTMS and DMDMS, and the third monomer used is MATMS. In preferred embodiments described in Example 3 (v)-(vii), the weight ratio between the TMOS, MTMS, DMDMS, MATMS and the water is about 3:12:3:2:3.85, 3:9:6:2:3.85 or 3:6:9:2:3.85, respectively.

In still another embodiment, the first mixture of monomers used is a mixture of TMOS and TEOT, the second monomer used is MTMS, and the third monomer used is MATMS. In preferred embodiments described in Example 3 (viii)-(xi), the weight ratio between the TMOS, TEOT, MTMS, MATMS and the water is about 2:1:15:2:3, 1.5:1.5:15:2:3, 1:3:15:2:3 or 1:5:15:2:3, respectively.

In yet another embodiment, the first mixture of monomers used is a mixture of TMOS and TBOT, the second monomer used is MTMS, and the third monomer used is MATMS. In a preferred embodiment described in Example 3 (xii), the weight ratio between the TMOS, TBOT, MTMS, MATMS and the water is about 2:1:15:2:3, respectively.

In still a further embodiment, the first mixture of monomers used is a mixture of TMOS and TEOT, the second mixture of monomers used is a mixture of MTMS and DMDMS, and the third monomer used is MATMS. In a preferred embodiment described in Example 3 (xiii), the weight ratio between the TMOS, TEOT, MTMS, DMDMS, MATMS and the water is about 1.5:1.5:14:3:2:3.5, respectively.

In yet a further embodiment, the first mixture of monomers used is a mixture of TMOS and TPOZ, the second monomer used is MTMS, and the third monomer used is MATMS. In a preferred embodiment described in Example 3 (xiv), the weight ratio between the TMOS, TPOZ, MTMS, MAIMS and the water is about 3:1:14:2:3.6, respectively.

In another embodiment, the first mixture of monomers used is a mixture of TMOS and TPOZ, the second mixture of monomers used is a mixture of MTMS and DMDMS, and the third monomer used is MATMS. In a preferred embodiment described in Example 3 (xv), the weight ratio between the TMOS, TPOZ, MTMS, DMDMS, MATMS and the water is about 2:1:12:3:2:2.9, respectively.

In a further embodiment, the first mixture of monomers used is a mixture of TMOS and TMOB, the second mixture of monomers used is a mixture of MTMS and DMDMS, and the third monomer used is MATMS. In preferred embodiments described in Example 3 (xvi)-(xviii), the weight ratio between the TMOS, TMOB, MTMS, DMDMS, MATMS and the water is about 1.5:1:12:3:2:3, 1.5:2:12:3:2:3 or 1.5:1:12:3:3:3, respectively.

Additional UV-curable inorganic-organic hybrid resins may be prepared by substituting any of the monomers used in the various embodiments defined hereinabove with an alternative monomer of the same type. For example, the first monomer can also be TEOZ or TEOA, and the third monomer may be GLYMO or vinyl silane instead of MATMS. Furthermore, different water concentration may be used, e.g., wherein the weight ratio of the water is in the range of 2.5-3.85.

The hydrolysis catalyst according to the present invention may be an acid or a base. Non-limiting examples of suitable acids include hydrochloric acid, nitric acid, sulfuric acid and methacrylic acid. Examples of suitable bases include, without being limited to, sodium hydroxide, potassium hydroxide, ammonia and fluoric ion. In a preferred embodiment, the hydrolysis catalyst is hydrochloric acid. In a more preferred embodiment, the concentration of the added hydrochloric acid is about 5 mM.

The photo-initiator according to the present invention may be any free radical initiator or cationic initiator capable of initiation of crosslinking of a sol-gel composition via the organic polymerizable tail groups upon exposure to UV radiation. Non-limiting examples of suitable photo-initiators include acetophenones, benzophenones, triazines, benzoins, benzoin ethers, xanthones, thioxanthones, acridines and benzoquinones. Preferred photo-initiators include Irgacure series such as Igracure 149, Igracure 184, Igracure 261, Igracure 369, Igracure 500, Igracure 651, Igracure 754, Irgacure 784, Igracure 819, Igracure 907, Igracure 1000 and Igracure 2959 (trade names, Ciba Specialty Chemicals Co.), as well as Degacure series such as Degacure K126 and Degacure K185 (trade names, Degussa GmbH). In a preferred embodiment, the photo-initiator is Irgacure 184, Irgacure 369 or Irgacure 819.

The UV-curable inorganic-organic hybrid resin obtained by the method of the present invention may be either immediately used or diluted for long-term storage without polymerization. As defined above, in case the hybrid resin prepared is immediately applied, the photo-initiator is added either to one of the monomers or mixtures of monomers in step (i) or to the water in step (ii) to thereby obtain, following step (iii), the UV-curable inorganic-organic hybrid resin desired. Alternatively, the inorganic-organic hybrid resin obtained in step (iii) is diluted by dissolving in a solution comprising a solvent capable of preventing polymerization and the photo-initiator, and optionally subsequently filtered, to thereby obtain a solution of the UV-curable inorganic-organic hybrid resin with the photo-initiator capable of long-term storage without polymerization. As found by the inventor of the present invention, the diluting solvent dissolves the sol-gel polymer particles and the stable suspension obtained can be kept for at least several months. In view of that, in one embodiment of the present invention, the UV-curable inorganic-organic hybrid resin is stored in a diluted form, without polymerization, for at least two months, preferably at least four months, more preferably at least six months.

The dilution of the inorganic-organic hybrid resin may be performed using any suitable solvent, herein designated also diluter, which can prevent or delay polymerization, and can dissolve large aggregates of sol-gel polymer. In one embodiment, the solvent capable of preventing polymerization is a polar organic solvent such as, without being limited to, tetrahydrofuran (THF), acetone, methylene chloride and ethylene tetrachloride. In a preferred embodiment, the solvent capable of preventing polymerization is THF or acetone. In a more preferred embodiment, the solvent capable of preventing polymerization is THF or acetone, the photo-initiator is Irgacure 184, Irgacure 369 or Irgacure 819, and the concentration of the photo-initiator in said solvent is in the range of 0.1-2.5%, preferably 0.5-1.8%, more preferably 0.5-1.2%. In any case, before curing of the UV-curable inorganic-organic hybrid resin, the diluter is evaporated in order to achieve the appropriate viscosity.

In one embodiment, the progress of the hydrolysis and poly-condensation step is controlled by monitoring changes in the temperature and the pressure during the process. In a preferred embodiment, the method of the present invention is carried out in an apparatus, preferably at least partially automated, capable of heating a reaction vessel, stirring a solution inside said reaction vessel, and controlling a pressure in said reaction vessel by opening a valve and evacuating volatile ingredients using an evacuating pump.

In one embodiment, the method of the present invention is carried out as defined above, wherein the photo-initiator is added to one of the monomers or mixtures of monomers in step (i) or to the water in step (ii) to obtain, following step (iii), the UV-curable inorganic-organic hybrid resin ready for use.

In another embodiment, the method of the present invention is carried out as defined above, wherein the inorganic-organic hybrid resin obtained in step (iii) is dissolved in the solution comprising the solvent capable of preventing polymerization and the photo-initiator, and optionally subsequently filtered, to thereby obtain a solution of the UV-curable inorganic-organic hybrid resin capable of long-term storage without polymerizing.

According to the present invention, the concentration of the inorganic-organic hybrid resin in the solution may be up to nearly 100% (wt) but it is preferably about 50% (wt). Accordingly, the viscosity of the solution obtained may be in a range of about 0.5 centipoise (cP), corresponding to nearly pure solvent, to about 5000 cP, corresponding to nearly pure resin, but is it preferably about 5 cP, obtained by dilution ratio of about 1:1 (wt:wt).

As defined above, the solution of the LTV-curable inorganic-organic hybrid resin may optionally be filtered, using any suitable filtration means, to insure homogeneity. In a preferred embodiment, the filtration is carried out using a 0.2 µm filter.

In view of all the aforesaid and as shown in Example 1 hereinafter, in one particular embodiment, the present invention relates to a method for preparation of a UV-curable inorganic-organic hybrid resin containing about or less than 4% volatiles and less than 30% organic residues, and capable of long-term storage without polymerizing, said method comprising the steps:

(i) introducing tetramethoxysilane (TMOS), methyltrimethoxysilane (MTMS) and trimethoxysilylpropylmethacrylate (MATMS), at a weight ratio of about 3:15:2, respectively, to a reaction vessel;

(ii) performing hydrolysis and poly-condensation of the TMOS, MTMS and MATMS, in the presence of 5 mM hydrochloric acid in water, to thereby release methanol that serves as a common solvent, wherein the weight ratio between the total amount of said TMOS, MTMS and MATMS and the water is about 20:3.85, respectively, the temperature is kept above 65° C. and below 102° C., and vapors of the methanol and the water are removed, thus keeping a constant pressure of about 2.5-3.5 atm;

(iii) reducing the pressure in the reaction vessel first to atmospheric pressure and then below 0.5 atm, thus evacuating remaining vapors of the methanol and the water to thereby obtain an inorganic-organic hybrid resin before gelation containing less than 4% volatiles; and (iv) dilluting the inorganic-organic hybrid resin obtained in a solution of 2% Irgacure 819 in tetrahydrofuran (THF) at a weight ratio of about 1:1, and subsequently filtering the solution obtained using a 0.2 µm filter, thus obtaining a solution of the desired UV-curable inorganic-organic hybrid resin capable of long-term storage without polymerizing, wherein steps (i) to (iv) are carried out in an apparatus capable of heating said reaction vessel, stirring a content of said reaction vessel, and controlling the pressure in said reaction vessel by opening a valve and evacuating volatile ingredients using an evacuating pump; and the inorganic-organic hybrid resin obtained in step (iii) has a weight that is less than 60%, preferably in a range of 47-53%, of the total weight of said TMOS, MTMS and MATMS introduced in step (i).

As defined above, the UV-curable inorganic-organic hybrid resin obtained by the method of the present invention enables, upon curing, the formation of a transparent glass-like product containing about or less than 4% volatiles and less than 30% organic residues. In view of its low volatile content, this product is, in fact, a transparent shrink- and crack-free glass-like product.

The term "shrink- and crack-free glass-like product" as used herein refers to a product obtained upon curing of a sol-gel material such as the UV-curable inorganic-organic hybrid resin prepared by the method of the present invention, containing about or less than 4%, preferably less than 3%, more preferably less than 2%, most preferably less than 1%, volatiles, and as a consequence, having a shrinkage rate of less than 4%, preferably less than 3%, more preferably less than 2%, most preferably less than 1%. In a most preferred embodiment, this term refers to a glass-like product having almost no shrinkage ratio and being free of cracks.

More specifically, the glass-like product formed upon curing of the UV-curable inorganic-organic hybrid resin has (i) a transparency of about 90% (measured for a 1 cm thick sample, equivalent to an absorption loss of 0.1 dB/cm) or more in the visible region, i.e., in the wavelength range of about 400 to about 700 nm, preferably in a wider range of about 300 to about 1000 nm, more preferably in a wider range of about 250 to about 1100 nm and of about 1250 to about 1350 nm; (ii) an optical loss lower than 0.1 dB/cm, preferably lower than 0.01 dB/cm, more preferably lower than 0.001 dB/cm, in the visible region; (iii) an adhesive strength, i.e., tensile shear strength, for glass to glass bonding of at least 7 megapascals (MPa), preferably at least 9 MPa, more preferably at least 10 MPa; (iv) a thermal stability greater than 200° C., preferably greater than 275° C., more preferably greater than 350° C.; and (v) a refractive index in the range of 1.42-1.46, preferably in a wider range of 1.40-1.50, more preferably in a wider range of 1.38-1.60. In addition, the surface hydrophobicity of the cured product described above may be designed to be either hydrophilic or hydrophobic.

Thus, in another aspect, the present invention provides a UV-curable inorganic-organic hybrid resin that enables, upon curing, the formation of a transparent glass-like product containing about or less than 4% volatiles and less than 30% organic residues. The UV-curable inorganic-organic hybrid resin of the present invention may be manufactured according to any suitable method or process, e.g., by the method described in detail above.

In one embodiment, the UV-curable inorganic-organic hybrid resin of the present invention contains less than 3%, preferably less than 2%, more preferably less than 1% volatiles, and less than 25%, preferably less than 20%, more preferably less than 15%, most preferably less than 10%, organic residues.

In one embodiment, the transparent glass-like product obtained upon curing of the UV-curable inorganic-organic hybrid resin of the present invention has (i) an optical loss lower than 0.1 dB/cm, preferably lower than 0.01 dB/cm, more preferably lower than 0.001 dB/cm, in the visible region; (ii) an adhesive strength for glass to glass bonding of at least 7 MPa, preferably at least 9 MPa, more preferably at least 10 MPa; and (iii) a thermal stability greater than 200° C., preferably greater than 275° C., more preferably greater than 350° C.

In one embodiment, the UV-curable inorganic-organic hybrid resin of the present invention is ready for use, i.e., can be immediately applied or molded and cured, e.g., by thermal curing, evaporation curing or UV-curing, preferably by UV-curing.

In another embodiment, the UV-curable inorganic-organic hybrid resin is dissolved in a solvent capable of preventing polymerization thus being capable of long-term storage without polymerization.

As the UV-curable inorganic-organic hybrid resin of the present invention contains not more than 4% volatiles, only a simple curing process is required so as to achieve complete residual liquid evacuation and full solidification. Due to the additional flexible organic tails in the silica skeleton of the hybrid resin, stresses are released, crack formation is avoided and crack-free bulk monoliths or films are produced. The hybrid resin can be cured by various means such as thermal curing, e.g., a few hours of low temperature (<100° C.) curing, and evaporation curing. Fourier transform infrared (FTIR) spectroscopy studies conducted have shown that by thermal curing as defined hereinabove, the polymerization of the hybrid resin was completed after 24 hours. However, many applications require a shorter curing procedure where UV-curing techniques are applied. These techniques are well established. UV-curing of sol-gel materials with high organic residues content was demonstrated and applied using organic modified silicates of the class organic modified ceramics (Streppel et al., 2002) and epoxy based hybrids (Guglielmi et al., 2007).

Figure 2:
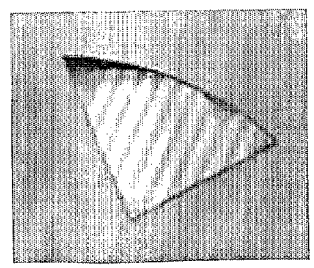
FIG. 2 shows a photo-lithographic application of the hybrid resin N-2, as described in Example 4: a thin resin film on silicon substrate was illuminated with a UV source through a patterned mask, resulting, after etching of the non-illuminated part, in a patterned glass structure (bright stripes) on silicon (dark stripes).
Figure 3A:
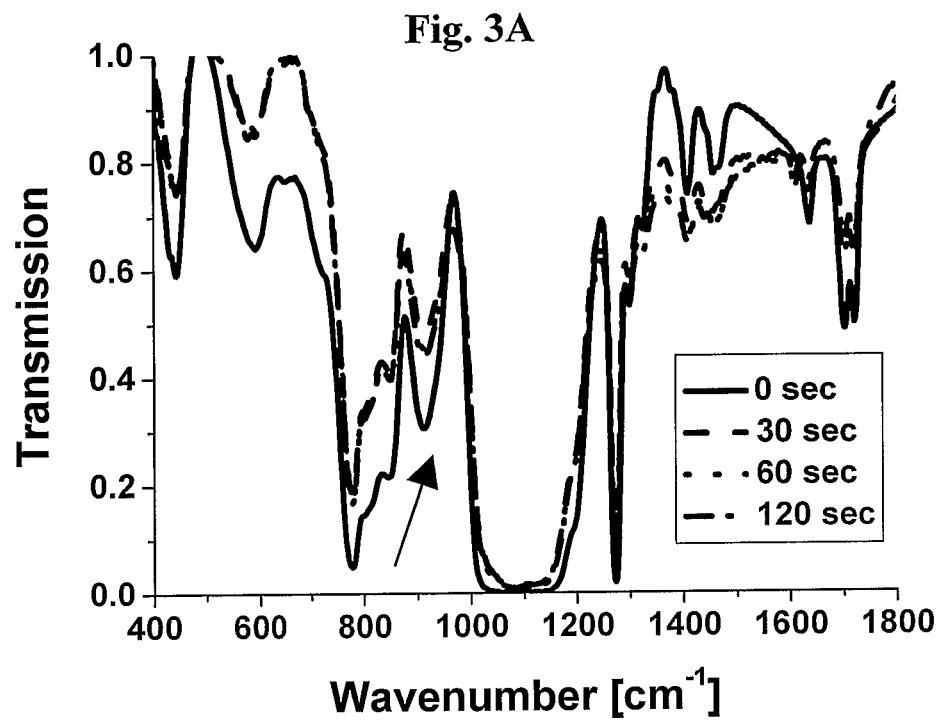
FIGS. 3A-3B show time dependent FTIR transmission of hybrid resin N-2 at different UV-curing times in two spectral regions: 400-1800 cm$^{-1}$ (3A) and 2500-4000 cm$^{-1}$ (3B).
Figure 3B:
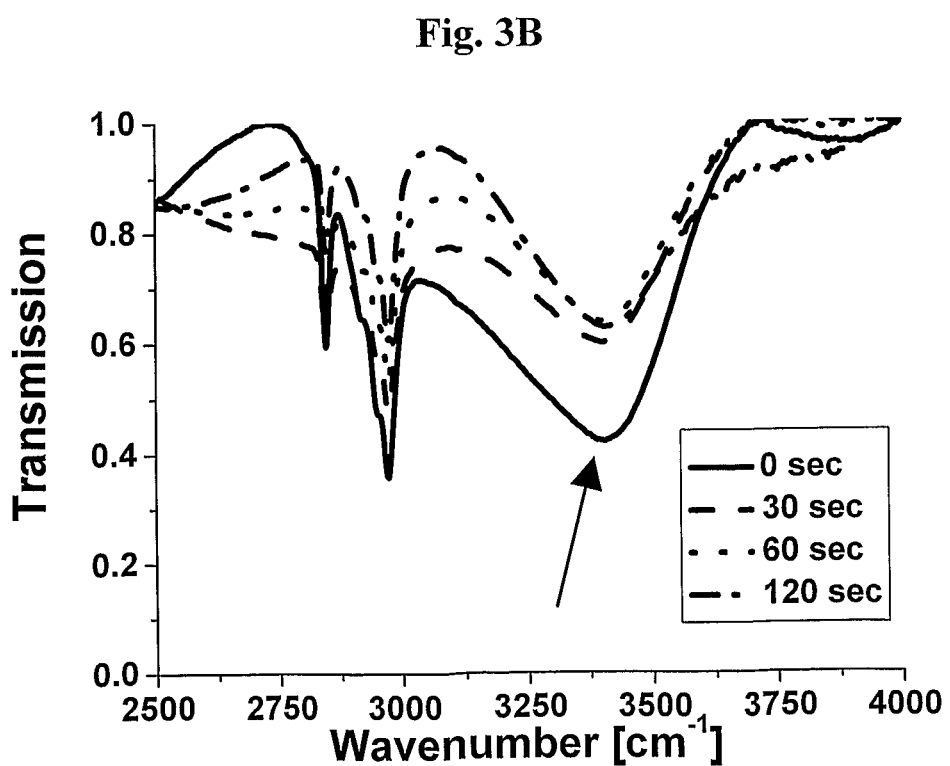

As defined above, a film of the UV-curable inorganic-organic hybrid resin of the present invention can be UV-cured within a very short time, i.e., a few minutes or less, depending on the intensity and spectral content of the UV-light source. As particularly shown in Example 4, a UV-curable inorganic-organic hybrid resin prepared using TMOS, MTMS and MATMS as precursors, diluted with a solution of 2% Irgacure 819 in THF, was coated on a silicon substrate using a spin coating technique, followed by UV exposure for 60 seconds through a lithographic mask, and removing the un-polymerized section using a developer. Stripe patterns of the coating material on the silicon substrate having a thickness of between 1-30 μm are shown in FIG. 2, and FTIR spectrum of said coating material as a function of UV-curing time is shown in FIGS. 3A-3B, indicating that the polymerization process of the UV-curable inorganic-organic hybrid resin was completed after 60 seconds only.

The UV-curable inorganic-organic hybrid resin of the present invention can be used in various applications such as electro-optic, microelectronic, stereolithography and biophotonic applications. In particular, it is useful (i) as adhesive material with well matched refractive index to avoid optical losses, e.g., in bonding of optical elements or optical fibers, for optical bonding between glasses and semiconductor materials, e.g., for energy conversion or optical detection uses, or as an optical adhesive for demanding environments where thermal stability must be taken into account; (ii) as a substrate material in fabrication of patterned nano- or microstructures, or of waveguides with lithographic or other techniques; (iii) as a material for stereo-photolithography or replica molding; (iv) as a transparent coating/encapsulating material of optical elements, electronic devices, chemicals, pharmaceuticals and cosmetics; and (v) as a transparent sealing material.

Thus, in a further aspect, the present invention provides a method for fabrication of a glass-like planar or three-dimensional structure having an optical loss lower than 0.1 dB/cm, preferably lower than 0.01 dB/cm, more preferably lower than 0.001 dB/cm, in the visible region, said method comprising molding a UV-curable inorganic-organic hybrid resin as defined above, evaporating the solvent capable of preventing polymerization, if present, and subsequently curing said resin.

In one embodiment, this method is used for fabrication of a micro- or nano-scale structure, using photo-lithographic fabrication techniques, two-photon absorption fabrication techniques, imprinting techniques or ink-jet like printing techniques.

In another embodiment, this method is used for fabrication of optical components such as lenses, mirrors, prisms and gratings.

The curing of the inorganic-organic hybrid resin according to this method may be thermal curing, e.g., at about 65° C. for about up to 24 hours, evaporation curing or UV-curing, but it is preferably UV-curing.

In still another aspect, the present invention provides a method for bonding of two elements, comprising applying a UV-curable inorganic-organic hybrid resin as defined above on said elements, evaporating the solvent capable of preventing polymerization, if present, bringing said elements into physical contact, and UV-curing of said resin. This method is preferably used for bonding of two elements wherein at least one of the elements is made of glass, a semiconductor material or a transparent material.

In one preferred embodiment, this method is used for bonding of two fibers, preferably wherein the refractive index of the bond formed between said two fibers is close to that of said two fibers. In another preferred embodiment, this method is used for bonding of a fiber to an optical element, a detector or a sensor.

In yet another aspect, the present invention provides a method for coating an element selected from a diode, a detector, a sensor or an optical component such as a lens, a mirror, a prism and a grating, said method comprising coating said element with a UV-curable inorganic-organic hybrid resin as defined above, evaporating the solvent capable of preventing polymerization, if present, and UV-curing of said resin. In preferred embodiments, this method is used for protecting said element from humidity, mechanical or radiative damage.

In still another aspect, the present invention provides a method for encapsulation of an optical or an electronic device, said method comprising coating said optical or electronic device with a UV-curable inorganic-organic hybrid resin as defined above, evaporating the solvent capable of preventing polymerization, if present, and UV-curing of said resin.

In still a further aspect, the present invention provides a method for encapsulation of an inorganic or organic material, said method comprising coating said inorganic or organic material with a LTV-curable inorganic-organic hybrid resin as defined above, evaporating the solvent capable of preventing polymerization, if present, and UV-curing of said resin. In one embodiment, this method is used for encapsulation of chemicals, pharmaceuticals or cosmetics.

The UV-curing of the UV-curable inorganic-organic hybrid resin in any one of the method of use defined above may be carried out, e.g., under a UV lamp such as, without being limited to, a UV lamp providing 20 mW/cm$^2$ during about 60 seconds. The UV-curing may further be accompanied with prebake and post exposure bake steps, wherein each one of these steps may be carried out, e.g., at about 65° C. during 1 minute.

In summary, sol-gel methods currently available can be roughly divided into two types, namely, methods for preparation of inorganic, i.e., classic, sol-gels that require a very slow process so as to fabricate crack-free products, and methods for preparation of inorganic-organic hybrids from which, e.g., UV-cured products containing high organic residue content can be rapidly fabricated. In other words, the UV-curable sol-gel materials currently available contain high organic residue content and are therefore limited in their optical, mechanical and thermal performances.

The present invention is directed to a process for fast preparation of a sol gel with low organic residues content, that enables, upon UV-curing, the formation of a shrink- and crack-free glass-like product as defined above, having high optical quality, high thermal and optical stability, and good bonding properties. The UV-curable hybrid resin obtained by this method combines the optical quality and the thermal stability of silica glass with the flexibility of organic polymers, wherein mechanical properties such as density and thermal expansion coefficient can be controlled and tuned, and optical properties such as refractive index can be engineered to match specific values. Therefore, this UV-curable hybrid resin is suitable, and in certain cases it is the only sol-gel material suitable, for use in various applications such as electro-optic, microelectronic, stereolithography and biophotonic applications. This UV-curable fast sol-gel material its further useful for bonding in a wide range of optical applications, e.g., optical bonding of fibers or of a fiber to an optical element, detector or sensor.

In contrast to the method of the present invention, classic sol-gel methods use a large excess of a common solvent, e.g., methanol or ethanol, thus require a considerable time for hydrolysis, condensation and evaporation procedures. This constraint makes products prepared by these routes inappropriate for commercial large quantity manufacturing and specifically for applications in which UV-curing is required. In addition, since sol-gel materials prepared by those methods contain relatively high content of volatiles, they lack long-term storage ability.

It should be further noted that since the UV-curing mechanism works on the organic polymerizable groups, UV-curable sol-gel materials prepared utilizing the currently available methods contain high organic residue content. Contrary to that, as the UV-curable inorganic-organic hybrid resin obtained by the method of the present invention is almost completely cross-linked and contains not more than about 4% volatiles, only an additional small quantity of organic cross-linkage polymer is required to accelerate the process as to achieve full solidification in a few seconds. As explained above, this additional cross-linkage is achieved by using a photo-initiator. Thus, unlike any other sol-gel method known in the art, the method of the present invention enables keeping the UV-curable inorganic-organic hybrid resin in solution state for long-term storage, and then achieving a full solidification of that hybrid resin by UV-curing to thereby obtain a crack- and shrink-free glass-like material in a few seconds, when desired.

The invention will now be illustrated by the following non-limiting Examples.

EXAMPLES

Example 1

Preparation of UV-Curable Inorganic-Organic Hybrid Resins Starting from TMOS, MTMS and MATMS Monomers A UV-curable inorganic-organic hybrid resin, herein identified hybrid resin N-2, was prepared using the precursors tetramethoxysilane (TMOS), methyltrimethoxysilane (MTMS) and 3-trimethoxysilylpropylmethacrylate (MATMS), and water, at a weight ratio of about 3:15:2:3.85 (TMOS:MTMS:MATMS:H$_2$O). Hydrochloric acid was added to the water as an hydrolysis catalyst at a concentration of 0.005 M, leading to a concentration of 0.0008 M in the reaction solution. All the ingredients were weighted in a semi-analytical balance (±0.001 g) and were then mixed in a 50 ml reaction bottle (Schott).

The fabrication process was carried out with an apparatus capable of heating the reaction bottle, stirring the solution in the reaction bottle and controlling the pressure by opening a valve and evacuating volatile ingredients using an evacuating pump. The initial reaction started in a closed system, insuring that the methanol released during the hydrolysis and polycondensation reactions is caged in the reaction bottle and therefore stays in the mixture as the common solvent. The temperature was raised until it reached about 95° C., which is above the boiling temperature of methanol (64.7° C.), allowing the methanol to generate vapors, and the pressure was limited to the range of 2.5-3 atm. After 5 minutes, which is the about time required for the hydrolysis and polycondensation reactions to occur, the pressure was gradually released, first to atmospheric pressure in a 2 minutes process, and then, using an evacuation pump, to below 0.5 atm, thus evacuating the volatile solvents left in the solution, i.e., methanol and water. The weight of the viscous inorganic-organic hybrid resin obtained was in the range of 47%-53% of the starting solution weight.

Additional UV-curable inorganic-organic hybrid resins, herein identified hybrid resins N-3 and N-4, respectively, were prepared using the same precursors at a weight ratio of about 3:14:3:3.85 and 3:13:4:3.85 (TMOS:MTMS:MATMS:H$_2$O [0.005 M HCl aq. solution]).

Example 2

Preparation of a UV-Curable Inorganic-Organic Hybrid Resin Starting from TMOS, MTMS and GLYMO Monomers In this experiment, a UV-curable inorganic-organic hybrid resin, herein identified hybrid resin E-2, which is different than that described in Example 1 was prepared, using the precursors tetramethoxysilane (TMOS), methyltrimethoxysilane (MTMS) and 3-glycidyoxypropyltimethoxysilane (GLYMO), and water, at a weight ratio of about 3:15:2:3.85 (TMOS:MTMS:GLYMO:H$_2$O). Hydrochloric acid was added to the water at a concentration of 0.005 M, leading to a concentration of 0.0008 M in the reaction solution. The fabrication process was performed as described in Example 1.

Example 3

Preparation of other UV-Curable Inorganic-Organic Hybrid Resins

The following UV-curable inorganic-organic hybrid resins are prepared as described in Example 1, starting from the various combinations of precursors and water, and at the weight ratios, as defined hereinbelow, wherein hydrochloric acid is used as an hydrolysis catalyst:

(i) Tetramethoxysilane (TMOS), methyltrimethoxysilane (MTMS) and 3-trimethoxysilylpropylmethacrylate (MATMS), at a weight ratio of about 3:14:3:3.85 (TMOS:MTMS:MATMS:$H_2O$).
(ii) TMOS, MTMS and MATMS, at a weight ratio of about 3:16:1:3.85 (TMOS:MTMS:MATMS:$H_2O$).
(iii) TMOS, MTMS and MATMS, at a weight ratio of about 5:13:2:3.85 (TMOS:MTMS:MATMS:$H_2O$).
(iv) TMOS, MTMS and MATMS, at a weight ratio of about 6:9:2:3.85 (TMOS:MTMS:MATMS:$H_2O$).
(v) TMOS, MTMS, dimethyldimethoxysilane (DMDMS) and MATMS, at a weight ratio of about 3:12:3:2:3.85 (TMOS:MTMS:DMDMS:MATMS:$H_2O$).
(vi) TMOS, MTMS, DMDMS and MATMS, at a weight ratio of about 3:9:6:2:3.85 (TMOS:MTMS:DMDMS:MATMS:$H_2O$).
(vii) TMOS, MTMS, DMDMS and MATMS, at a weight ratio of about 3:6:9:2:3.85 (TMOS:MTMS:DMDMS:MATMS:$H_2O$).
(viii) TMOS, tetraethylorthotitanate (TEOT), MTMS and MATMS, at a weight ratio of about 2:1:15:2:3 (TMOS:TEOT:MTMS:MATMS:$H_2O$).
(ix) TMOS, TEOT, MTMS and MATMS, at a weight ratio of about 1.5:1.5:15:2:3 (TMOS:TEOT:MTMS:MATMS:$H_2O$).
(x) TMOS, TEOT, MTMS and MATMS, at a weight ratio of about 1:3:15:2:3 (TMOS:TEOT:MTMS:MATMS:$H_2O$).
(xi) TMOS, TEOT, MTMS and MATMS, at a weight ratio of about 1:5:15:2:3 (TMOS:TEOT:MTMS:MATMS:$H_2O$).
(xii) TMOS, tetrabutylorthotitanate (TBOT), MTMS, and MATMS, at a weight ratio of about 2:1:15:2:3 (TMOS:TBOT:MTMS:MATMS:$H_2O$).
(xiii) TMOS, TEOT, MTMS, DMDMS and MATMS, at a weight ratio of about 1.5:1.5:14:3:2:3.5 (TMOS:TEOT:MTMS:DMDMS:MATMS:$H_2O$).
(xiv) TMOS, zirconium tetrapropoxide (TPOZ), MTMS and MATMS, at a weight ratio of about 3:1:14:2:3.6 (TMOS:TPOZ:MTMS:MATMS:$H_2O$).
(xv) TMOS, TPOZ, MTMS, DMDMS and MATMS, at a weight ratio of about 2:1:12:3:2:2.9 (TMOS:TPOZ:MTMS:DMDMS:MATMS:$H_2O$).
(xvi) TMOS, trimethoxyborane (TMOB), MTMS, DMDMS and MATMS, at a weight ratio of about 1.5:1:12:3:2:3 (TMOS:TMOB:MTMS:DMDMS:MATMS:$H_2O$).
(xvii) TMOS, TMOB, MTMS, DMDMS and MATMS, at a weight ratio of about 1.5:2:12:3:2:3 (TMOS:TMOB:MTMS:DMDMS:MATMS:$H_2O$).
(xviii) TMOS, TMOB, MTMS, DMDMS and MATMS, at a weight ratio of about 1.5:1:12:3:3:3 (TMOS:TMOB:MTMS:DMDMS:MATMS:$H_2O$).

Additional UV-curable inorganic-organic hybrid resins may be prepared by substituting any of the monomers used with an alternative monomer of the same type. For example, the first monomer can also be aluminum triethoxide (TEOA) or zirconium tetraethoxide (TEOZ), and the third monomer may be 3-glycidyoxpropyltimethoxysilane (GLYMO) or vinyl silane instead of MATMS. Furthermore, different water concentration may be used, e.g., wherein the weight ratio of the water is in the range of 2.5-3.85.

Example 4

Curing of the UV-Curable Inorganic-Organic Hybrid Resin

The hybrid resin N-2, prepared as described in Example 1, was diluted using tetrahydrofuran (THF) in a ratio of 1:1 (wt) to achieve a viscosity of about 5 centipoises (cPs), wherein the photo-initiator Irgacure 819, at a concentration of 0.5-1%, was added to the diluter solution. The solution obtained was coated on a silicon substrate using a spin coating technique, followed by UV exposure for 60 seconds through a lithographic mask using a 20 mW/$cm^2$ UV lamp, and washing the un-polymerized section using a developer, in particular, metal-ion-free (MIF)-319, for 2 minutes.

FIG. 2 shows stripe patterns of the UV-cured fast sol-gel material on the silicon substrate. For the fabrication of this stripe patterns, prebake and post exposure bake at 65° C. during 1 minute each were performed before and after the exposure to the UV lamp. The thickness obtained was controlled between 1 to 30 μm. The thickness depends only on the viscosity of the hybrid resin prepared and the speed of the spinner. Samples ranging from sub-micron up to several hundreds microns can be prepared in this way.

FIGS. 3A-3B show the FTIR spectrum as a function of UV-curing time, wherein the spectrum is divided into two absorption ranges: 400-1800 $cm^{-1}$ (3A) and 2500-4000 $cm^{-1}$ (3B). As shown, the increase in transmission is observed at 3400 $cm^{-1}$ and at 900 $cm^{-1}$, corresponding to OH stretching and Si—OH bending (Cothup et al., 1964), respectively, as well as 1180 $cm^{-1}$, corresponding to Si—O—$CH_3$ (Jabbour et al., 2007). These spectra represent the progress of the polymerization process and indicate that the polymerization was already completed after 60 seconds.

Example 5

Analysis of the Final Composition of the Glass-Like Product

The hybrid resin N-2, prepared as described in Example 1, was thermally cured, and the final composition of the glass-like product, i.e., the fractions of Si, O and C in the material, was tested using an x-ray photoelectron spectrometry (XPS). The results obtained were then used for extraction of the final glass composition and the organic residues percentage. The values obtained for Si, O and C were 40.0 w %, 37.5 w % and 22.5 w %, respectively, leading to atomic ratio of 1:1.64:1.31, which fits a unit molecular structure of $SiO_{1.5}(CH_3)_{0.8}(C_7H_{11}O_2)_{0.07}$ that includes a 28.93 w % of organic residues. An approximate calculation of the organic residues percentage from the initial precursors gave the value of about 27%.

Example 6

The Photo-Initiator and the Diluter Effect the Curing Process of the UV-Curable Inorganic-Organic Hybrid Resin In this study, the completion of the UV-curing process was tested using Fourier Transform Infrared (FTIR) spectra by looking at the $OH^-$ peak at 3400 $cm^{-1}$, which is an indication for polymerization progress.

The hybrid resins N-2, N-3 and N-4, prepared as described in Example 1, were diluted using THF in a ratio of 1:1 (wt) to achieve a viscosity of about 5 cPs, wherein a photo-initiator for initiation of the polymerization process, at a concentration of 0.5-1%, is added to the diluter solution. As to insure a homogeneous product, the solution was then filtered with a 0.2 μm filter. In order to study the influence of different photo-initiators, different photo-initiators were added.

Figure 4:
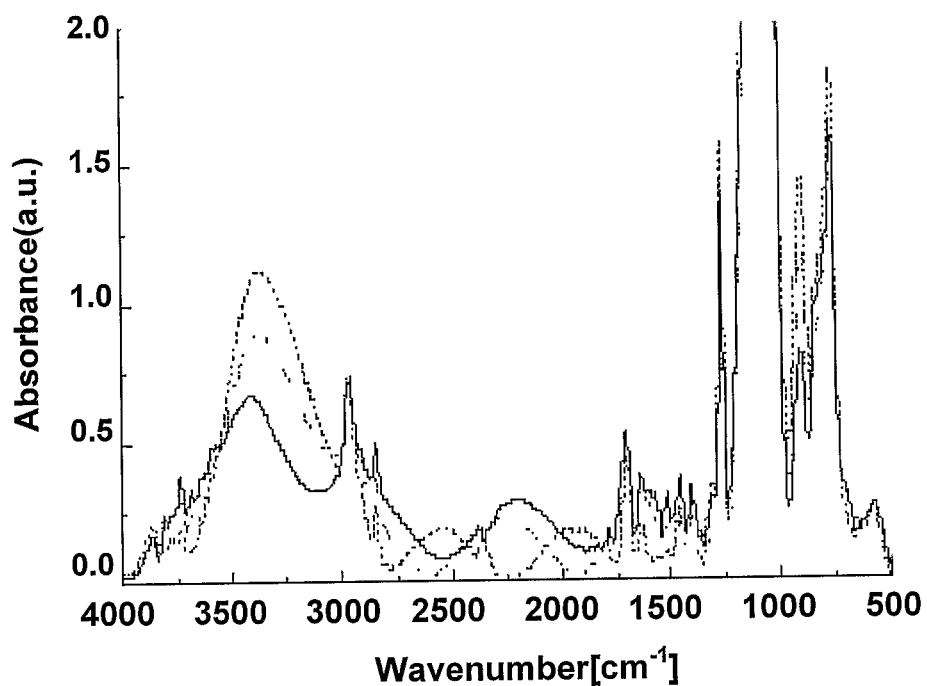
FIG. 4 shows FTIR spectra of hybrid resin N-2, prepared as described in Example 6, thin films on silicone wafer dried by UV-curing using the three photo-initiators Irgacure 184 1% (dash curve), Irgacure 819 0.5% (dots curve) or Irgacure 369 0.5% (solid line curve).
Figure 5:
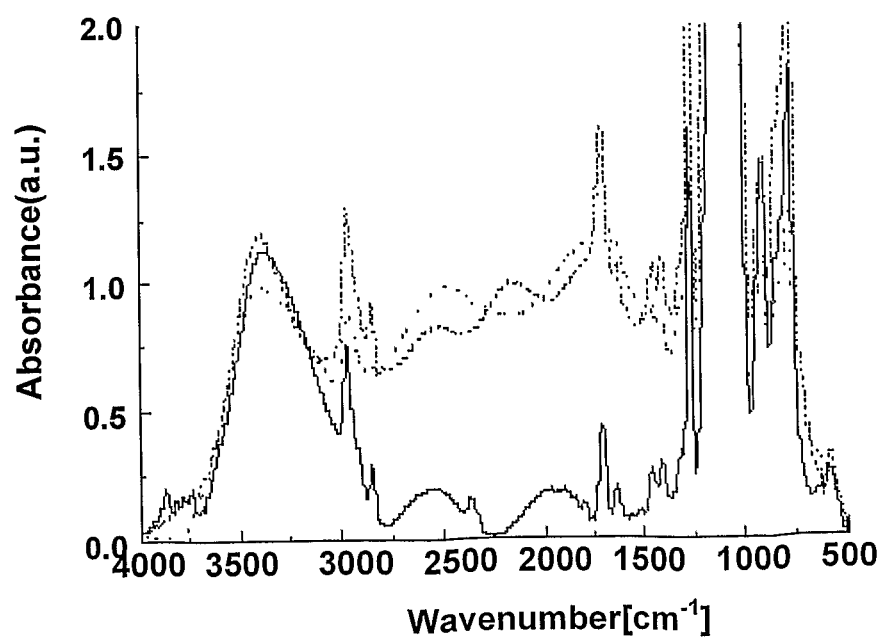
FIG. 5 shows FTIR spectra of hybrid resins N-2 (solid line curve), N-3 (dots curve) and N-4 (dash curve), prepared as described in Example 6, thin films on silicone wafer dried by UV-curing using the photo-initiator Irgacure 184 1%.

FIG. 4 shows FTIR spectra of the hybrid resin N-2 thin films on silicone wafer dried by UV-curing using the three photo-initiators Irgacure 184, Irgacure 819 and Irgacure 369 (Ciba). As shown, the UV-curing of the fast sol-gel thin film containing Irgacure 369 was faster than that of the other sol-gels tested, and the UV-curing of the fast sol-gel thin film containing Irgacure 184 was the slowest. However, Irgacure 184 was found to be more appropriate for bonding since it does not lead to cracks during the bonding. FIG. 5 shows FTIR spectra of hybrid resins N-2, N-3 and N-4 thin films on silicone wafer dried by UV-curing using the photo-initiator Irgacure 184. As shown, the polymerization process of hybrid resin N-4 was slightly faster than that of the other fast sol-gels.

In order to study the influence of the diluter, the hybrid resins N-2, N-3 and N-4 were diluted as described above using different diluter solvents, in particular, tetrahydrofuran (THF), acetone and N-methyl-2-pyrrolidone (NMP). As found, acetone evaporated faster than the other two diluters, THF was a little bit slower, and NMP was found to be not appropriate due to much longer evaporation time (data not shown).

Example 7

The Optical Quality and Adhesive Strength of the Bonding Formed with the UV-Cured Inorganic-Organic Hybrid Resin In this study, the optical quality of the bonding performed with the hybrid resin N-2, prepared as described in Example 1 and diluted as described in Example 6 with THF containing the three different photo-initiators Irgacure 184, Irgacure 819 and Irgacure 369, was studied using UV-visible-NIR spectrometer.

Figure 6:
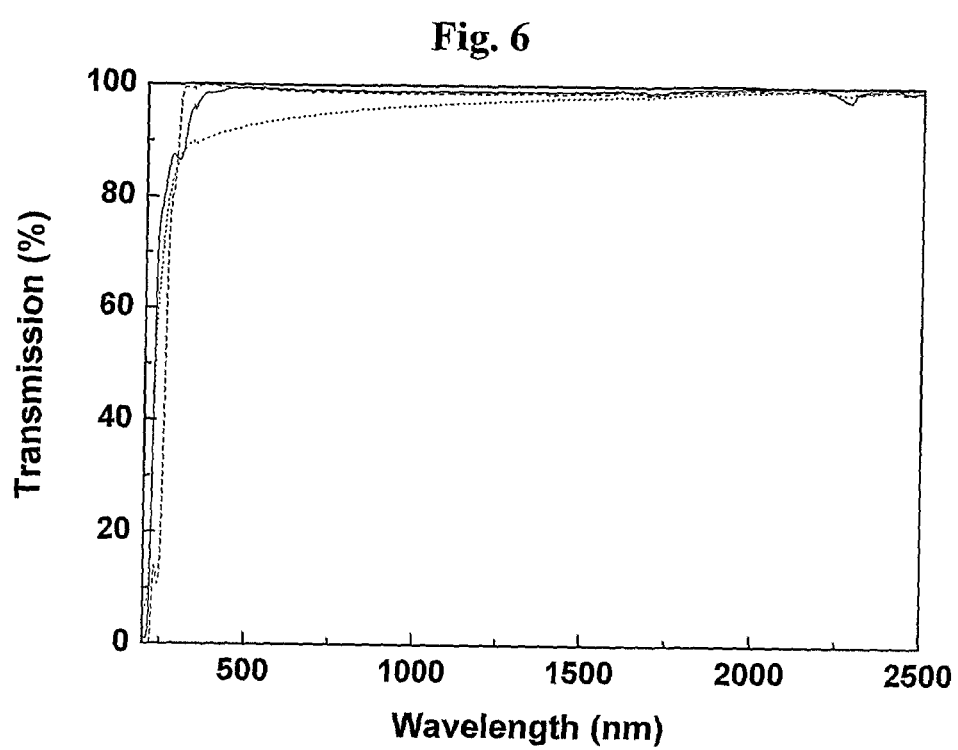
FIG. 6 shows UV-NIR spectra of hybrid resin N-2, prepared as described in Example 7, thin films on fused silica block dried by UV-curing using the photo-initiators Irgacure 369 0.5% (solid line curve), Irgacure 819 0.5% (dots curve) or Irgacure 184 1% (dash curve).

Thin film layers of the fast sol gel were prepared on fused silica, using the three different photo-initiators Irgacure 184, Irgacure 819 and Irgacure 369, and the transparency of each one of the layers was measured using spectrophotometer in the range 200-2500 nm. As shown in FIG. 6, films with Irgacure 369 and Irgacure 819 have a significant absorption around 360-400 nm leading to a yellowish color of the film. In contrast, films with Irgacure 184 are transparent down to 300 nm (absorption loss<0.1 dB/cm).

The fast sol-gel hybrids containing Irgacure 184 as the photo-initiator were then tested as UV-cured adhesive materials on reference samples, in particular, fused silica blocks, and on optical devices, in particular, set of fused silica block and semiconductor wafer or BK-7 glass prism and semiconductor wafer.

The bonding strength was tested using the Cometech material testing machine model QC-506B 1. The two bonded fused silica were bonded to aluminum sticks using epoxy adhesive DP-460 by 3M, with a 24 MPa adhesive strength, and the aluminum sticks were placed and held in the test machine. An adhesive strength of over 10 MPa was obtained for the thermally cured hybrid resin N-2 while for the UV-cured hybrid resin N-2, an adhesive strength of 5.5 MPa was achieved. Nevertheless, it is postulated that by improving the UV-curing bonding process, an adhesive strength of over 7 MPa and even over 10 MPa can be achieved.

REFERENCES

Altman J. C., Stone R. E., Dunn B., Nishida F., *IEEE Photo. Tech. Lett.,* 1991, 3, 189-190

Cothup N. B., Daly L H., Wiberley S. E., "Introduction to Infrared and Raman Spectroscopy", Academic Press, New-York and London, 1964

Dislich H., Chap 4 In: Klein L C (ed) Sol-Gel Technology for Thin films, Performs, Electronics and Specialty Shapes, Noyes New Jersey 1988

Guglielmi M., Brusatin G., Della Giustina G., *J. of Non-Cryst. Solids,* 2007, 353, 1681-1687

Gutina A., Haruvy Y., Gilath I., Axelrod E., Kozlovich N., Feldman Y., *J. Phys. Chem. B,* 1999, 103, 5454

Gvishi R., *J. of Sol-Gel Sci. and Tech.,* 2009, 50, 241-253

Haas K. H., Amberg-Schwab S., Rose K., *Thin Solid Films,* 1999a, 351, 198-203

Haas K. H., Amberg-Schwab S., Rose K., Schottner G., *Surf Coat. Technol.,* 1999b, 111, 72-79

Haruvy Y., Heller A., Webber S. E., Chap. 28 In: Bein T (ed) Supramolecular Architecture: Synthetic Control in Thin Films and Solids, Proc ACS Sym, 1992

Hench L. L., West J. K., *Chem Rev.,* 1990, 90, 33-72

Jabbour J., Calas S., Gatti S., Kribich R. K., Myara M., Pille G., Etienne P., Moreau Y., *J. Non-Cryst Solids,* 2007, 354, 651

Klein L. C., Sol-Gel technology for thin films, performs, electronics and specialty shapes, Noyes, New Jersey, 1988

Klein L. C., Sol-Gel Optics: Processing and Applications, Kluwer Academic Publishers, Boston, 1993

Pellice S. A., Williams R. J. J., Sobrados I., Sanz J., Castrro Y., Aparicio M., Duran A., *J Materials Chemistry,* 2006, 16, 3318

Schmidt H., pp 327-335 In: Brinker C J, Clark D E, Ulrich D R (eds) Better Ceramics Through Chemistry, North-Holland, N.Y., 1984

Schmidt H., In: Aegerter et al. (ed) Sol-Gel Science and Technology, World Scientific, 1989

Streppel U., Dannberg P., Wachter C., Brauer A., Fronhlich L., Houbertz R., Popall M., *Optical Materials,* 2002, 21, 475

The invention claimed is:

1. A method for preparation of a UV-curable resin product or solution thereof, said method comprising the steps:

(i) providing (a) a first monomer or first mixture of monomers each independently being a metal alkoxide; (b) a second monomer or second mixture of monomers each independently being a metal alkoxide in which at least one but not all the alkoxyl groups is substituted by a non-polymerizable group; and (c) a third monomer or third mixture of monomers each independently being a metal alkoxide in which at least one but not all the alkoxyl groups is substituted by a non-hydrolyzable polymerizable group;

(ii) performing hydrolysis and poly-condensation of said monomers or mixtures of monomers of (a), (b) and (c) in the presence of water and an hydrolysis catalyst, in a closed system, at an elevated temperature and pressure, to thereby release an alcohol that serves as a common solvent, while said temperature is kept above the boiling point of said alcohol and below the boiling point of said monomers, and vapors of said solvent and the water are removed, thus keeping a constant pressure; and (iii) reducing the pressure in said system below atmospheric pressure, thus evacuating remaining vapors of said solvent and the water to thereby obtain a resin product,
wherein either:
a photo-initiator is added to one of the monomers or mixtures of monomers in step (i) or to the water in step (ii) to thereby obtain, following step (iii), the UV-curable resin product; or
the resin product obtained in step (iii) is dissolved in a solution comprising a solvent capable of preventing or delaying polymerization and a photo-initiator, and optionally subsequently filtered, to thereby obtain a solution of the UV-curable resin product capable of long-term storage without polymerizing.

2. The method of claim 1, wherein said metal alkoxide is an alkoxide of a metal selected from the group consisting of a transition metal, a lanthanide metal, Al, Si, and B, and a $C_1$-$C_{10}$ straight or branched alkyl; said non-polymerizable group is H or a $C_1$-$C_{10}$ straight or branched alkanol; and said non-hydrolyzable polymerizable group is an acrylate, an epoxide, a vinyl group, or a styrene group.

3. The method of claim 2, wherein said metal alkoxide is an alkoxide of a metal selected from the group consisting of Si, Ti, Zr and B, and a $C_1$-$C_6$ straight alkyl.

4. The method of claim 2, wherein said transition metal is Ti, V, Y or Zr; said lanthanide metal is Ce, Pr, Nd, Pm, Sm, Eu, Gd, Tb, Dy, Ho, Er, Tm, Yb or Lu; said acrylate is a methacrylate; said epoxide is a glycidyoxpropyl; said vinyl group is vinyltriethoxysilane or vinyltriisopropoxysilane; or said styrene group is styrlethyltrimethoxysilane.

5. The method of claim 1, wherein said metal alkoxide is tetramethoxysilane (TMOS), tetraethoxysilane (TEOS), tetraethylorthotianate (TEOT), tetrabutylorthotitanate (TBOT), zirconium tetrapropoxide (TPOZ), zirconium tetraethoxide (TEOZ), aluminum ethoxide (TEOA) or trimethoxyborane (TMOB); said metal alkoxide in which at least one but not all the alkoxyl groups is substituted by a non-polymerizable group is methyltrimethoxysilane (MTMS) or dimethyldimethoxysilane (DMDMS); and said metal alkoxide in which at least one but not all the alkoxyl groups is substituted by a non-hydrolyzable polymerizable group is 3-trimethoxysilylpropylmethacrylate (MATMS), 3-glycidyoxpropyltimethoxysilane (GLYMO) or vinyl silane.

6. The method of claim 1, wherein the alcohol released during step (ii) is methanol, ethanol or a mixture thereof.

7. The method of claim 6, wherein said alcohol is methanol, the temperature is in a range of 65-102° C., and the pressure is in a range of 2.5-4 atm.

8. The method of claim 1, wherein the weight ratio of said first monomer or first mixture of monomers : said second monomer or second mixture of monomers: said third monomer or third mixture of monomers is in a range of 10 to 50:50 to 90: up to 20 respectively; and the molar ratio of total monomers to water is in a range of 1:1.5-2.5, wherein said total monomers is said first monomer or mixture of monomers, said second monomer or mixture of monomers, and said third monomer or mixture of monomers.

9. The method of claim 1, wherein (i) said first monomer is TMOS, said second monomer is MTMS and said third monomer is MATMS; (ii) said first monomer is TMOS, said second monomer is MTMS and said third monomer is GLYMO; (iii) said first monomer is TMOS, said second mixture of monomers is a mixture of MTMS and DMDMS, and said third monomer is MATMS; (iv) said first mixture of monomers is a mixture of TMOS and TEOT, said second monomer is MTMS, and said third monomer is MATMS; (v) said first mixture of monomers is a mixture of TMOS and TBOT, said second monomer is MTMS, and said third monomer is MATMS; (vi) said first mixture of monomers is a mixture of TMOS and TEOT, said second mixture of monomers is a mixture of MTMS and DMDMS, and said third monomer is MATMS; (vii) said first mixture of monomers is a mixture of TMOS and TPOZ, said second monomer is MTMS, and said third monomer is MATMS; (viii) said first mixture of monomers is a mixture of TMOS and TPOZ, said second mixture of monomers is a mixture of MTMS and DMDMS, and said third monomer is MATMS; or (ix) said first mixture of monomers is a mixture of TMOS and TMOB, said second mixture of monomers is a mixture of MTMS and DMDMS, and said third monomer is MATMS.

10. The method of claim 9, wherein said first monomer is TMOS, said second monomer is MTMS and said third monomer is MATMS or GLYMO, the weight ratio of said first monomer : said second monomer : said third monomer : the water is about 3:15:2:3.85, 3:14:3:3.85 or 3:13:4:3.85, respectively, the alcohol released during step (ii) is methanol, the temperature is kept above 65° C. and below 102° C., vapors of the methanol and the water are removed above a pressure of about 2.5-3.5 atm, thus keeping a constant pressure, and the resin product obtained in step (iii) has a weight that is less than 60% of the total weight of the TMOS, MTMS and either MATMS or GLYMO provided in step (i).

11. The method of claim 1, wherein said hydrolysis catalyst is an acid or a base.

12. The method of claim 11, wherein said acid is hydrochloric acid, nitric acid, sulfuric acid or methacrylic acid; or said base is sodium hydroxide, potassium hydroxide, ammonia or fluoric ion.

13. The method of claim 1, wherein said photo-initiator is Irgacure 184, Irgacure 819 or Irgacure 369 (Ciba Geigy); and said solvent capable of preventing polymerization is a polar organic solvent.

14. The method of claim 13, wherein said photo-initiator is Irgacure 184, Irgacure 819 or Irgacure 369, said solvent capable of preventing polymerization is THF or acetone, and the concentration of said photo-initiator in said solvent capable of preventing polymerization is in a range of 0.1-2.5% (wt).

15. The method of claim 13, wherein said polar organic solvent is tetrahydrofuran (THF), acetone, methylene chloride or ethylene tetrachloride.

16. The method of claim 1, wherein a progress of said hydrolysis and poly-condensation step (ii) is controlled by monitoring changes in the temperature and the pressure.

17. The method of claim 16, wherein steps (i) to (iii) are carried out in an apparatus capable of heating a reaction vessel, stirring a solution inside said reaction vessel, and controlling a pressure in said reaction vessel by opening a valve and evacuating volatile ingredients using an evacuating pump.

18. The method of claim 1, wherein
the resin product obtained in step (iii) is dissolved in said solution comprising said solvent capable of preventing or delaying polymerization and said photo-initiator, and optionally subsequently filtered, to thereby obtain a solution of the UV-curable resin product capable of long-term storage without polymerizing.

19. The method of claim 18, wherein the concentration of said resin product in said solution is up to nearly 100% (wt); and the viscosity of said solution is in a range of about 0.5 centipoise (cP) to about 5000 cP; and wherein the solution is filtered using a 0.2 μm filter.

20. The method of claim 1, comprising the steps:
(i) introducing TMOS, MTMS and MATMS, as said first monomer, said second monomer, and said third monomer, respectively, to a reaction vessel, wherein the weight ratio of said TMOS:MTMS:MATMS is about 3:15:2, respectively;
(ii) performing hydrolysis and poly-condensation of the TMOS, MTMS and MATMS, in the presence of 5 mM hydrochloric acid, as said hydrolysis catalyst, in water, in a closed system, to thereby release methanol that serves as a common solvent, wherein the weight ratio between the total amount of said TMOS, MTMS and MATMS and the water is about 20:3.85, respectively, the temperature is kept above 65° C. and below 102° C., and vapors of the methanol and the water are removed, thus keeping a constant pressure of about 2.5-3.5 atm;
(iii) reducing the pressure in the reaction vessel first to atmospheric pressure and then below 0.5 atm, thus evacuating remaining vapors of the methanol and the water to thereby obtain an inorganic-organic hybrid resin before gelation containing less than 4% volatiles; and
(iv) diluting the inorganic-organic hybrid resin obtained in a 2% solution of the photo-initiator Irgacure 819 in THF at a weight ratio of about 1:1, said solution being capable of preventing polymerization, and subsequently filtering the solution obtained using a 0.2 μm filter, thus obtaining a solution of the UV-curable inorganic-organic hybrid resin capable of long-term storage without polymerizing,
wherein steps (i) to (iv) are carried out in an apparatus capable of heating said reaction vessel, stirring a content of said reaction vessel, and controlling the pressure in said reaction vessel by opening a valve and evacuating volatile ingredients using an evacuating pump; and
wherein the inorganic-organic hybrid resin obtained in step (iii) has a weight that is less than 60% of the total weight of said TMOS, MTMS and MATMS introduced in step (i).

21. The method of claim 1, wherein the photo-initiator is added to one of the monomers or mixtures of monomers in step (i) or to the water in step (ii) to thereby obtain, following step (iii), the UV-curable resin produt.

22. A product comprising (a) a UV-curable resin material comprising about or less than 4% (wt) volatiles and a UV-curable inorganic-organic hybrid resin containing less than 30% (wt) organic residues, or (b) a solution comprising said UV-curable resin material of (a) dissolved in a solvent capable of preventing or delaying polymerization.

23. The product of claim 22, wherein said UV-curable resin material has (i) an optical loss lower than 0.1 dB/cm in the visible region; (ii) an adhesive strength for glass to glass bonding of at least 7 MPa; and (iii) a thermal stability greater than 200° C.

24. The product of claim 22, comprising said solution of (b), said solution being capable of long-term storage without polymerization.

25. In a method for fabricating an article from, or coating or encapsulating an article with, or bonding two articles with, a resin, the improvement comprising using as said resin the product of claim 22, and curing said resin material.

26. The method of claim 25, further characterized as being for fabrication of a glass-like planar or three-dimensional structure having an optical loss lower than 0.1 dB/cm in the visible region, said method comprising molding said product, evaporating the solvent capable of preventing or delaying polymerization, if present, and subsequently curing said resin material.

27. The method of claim 26, for fabrication of a micro- or nano-scale structure, using photo-lithographic fabrication techniques, two-photon absorption fabrication techniques, imprinting techniques or ink-jet like printing techniques; or for fabrication of optical components.

28. The method of claim 26, wherein said curing is thermal curing, evaporation curing or UV-curing.

29. The method of claim 27, wherein said optical components are lenses, mirrors, prisms or gratings.

30. The method of claim 25, further characterized as being for optical bonding of two elements, said method comprising applying said product on said elements, evaporating the solvent capable of preventing or delaying polymerization, if present, bringing said elements into physical contact, and UV-curing of said resin material.

31. The method of claim 30, for bonding of two fibers, or for bonding of a fiber to an optical element, a detector or a sensor.

32. The method of claim 31 for bonding of two fibers, wherein the refractive index of a bond formed between said two fibers is close to that of said two fibers.

33. The method of claim 25, further characterized as being for coating an element selected from a diode, a detector, a sensor or an optical component, said method comprising coating said element with said product, evaporating the solvent capable of preventing or delaying polymerization, if present, and UV-curing of said resin material.

34. The method of claim 33, for protecting said element from humidity, mechanical or radiative damage.

35. The method of claim 25, further characterized as being for encapsulation of an optical or an electronic device, said method comprising coating said optical or electronic device with said product, evaporating the solvent capable of preventing or delaying polymerization, if present, and UV-curing of said resin material.

36. The method of claim 25, further characterized as being for encapsulation of an inorganic or organic material, said method comprising coating said inorganic or organic material with said product, evaporating the solvent capable of preventing or delaying polymerization, if present, and UV-curing of said resin material.

37. The method of claim 36, wherein said inorganic or organic material is a chemical, a pharmaceutical or a cosmetic material.

38. The product of claim 22, wherein said resin material contains not more than 4.4% (wt) of volatiles.

39. The product of claim 22, wherein said UV-curable inorganic-organic hybrid resin comprises a plurality of residues of (a) a first monomer or first mixture of monomers each independently being a metal alkoxide; (b) a second monomer or second mixture of monomers each independently being a metal alkoxide in which at least one but not all the alkoxyl groups is substituted by a non-polymerizable group; and (c) a third monomer or third mixture of monomers each independently being a metal alkoxide in which at least one but not all the alkoxyl groups is substituted by a non-hydrolyzable polymerizable group.

40. The product of claim 39, wherein said metal alkoxide is an alkoxide of a metal selected from the group consisting of a transition metal, a lanthanide metal, Al, Si, and B, and a $C_1$-$C_{10}$ straight or branched alkyl; said non-polymerizable group is H or a $C_1$-$C_{10}$ straight or branched alkanol; and said non-hydrolyzable polymerizable group is an acrylate, an epoxide, a vinyl group, or a styrene group.

41. The product of claim 39, wherein said metal alkoxide is tetramethoxysilane (TMOS), tetraethoxysilane (TEOS), tetraethylorthotianate (TEOT), tetrabutylorthotitanate (TBOT), zirconium tetrapropoxide (TPOZ), zirconium tetraethoxide (TEOZ), aluminum ethoxide (TEOA) or trimethoxyborane (TMOB); said metal alkoxide in which at least one but not all the alkoxyl groups is substituted by a non-polymerizable group is methyltrimethoxysilane (MTMS) or dimethyldimethoxysilane (DMDMS); and said metal alkoxide in which at least one but not all the alkoxyl groups is substituted by a non-hydrolyzable polymerizable group is 3-trimethoxysilylpropylmethacrylate (MATMS), 3-glycidyoxpropyltimethoxysilane (GLYMO) or vinyl silane.

42. The product of claim 39, wherein (i) said first monomer is TMOS, said second monomer is MTMS and said third monomer is MATMS; (ii) said first monomer is TMOS, said second monomer is MTMS and said third monomer is GLYMO; (iii) said first monomer is TMOS, said second mixture of monomers is a mixture of MTMS and DMDMS, and said third monomer is MATMS; (iv) said first mixture of monomers is a mixture of TMOS and TEOT, said second monomer is MTMS, and said third monomer is MATMS; (v) said first mixture of monomers is a mixture of TMOS and TBOT, said second monomer is MTMS, and said third monomer is MATMS; (vi) said first mixture of monomers is a mixture of TMOS and TEOT, said second mixture of monomers is a mixture of MTMS and DMDMS, and said third monomer is MATMS; (vii) said first mixture of monomers is a mixture of TMOS and TPOZ, said second monomer is MTMS, and said third monomer is MATMS; (viii) said first mixture of monomers is a mixture of TMOS and TPOZ, said second mixture of monomers is a mixture of MTMS and DMDMS, and said third monomer is MATMS; or (ix) said first mixture of monomers is a mixture of TMOS and TMOB, said second mixture of monomers is a mixture of MTMS and DMDMS, and said third monomer is MATMS.

43. The product of claim 40, wherein said metal alkoxide is an alkoxide of a metal selected from the group consisting of Si, Ti, Zr and B, and a $C_1$-$C_6$ straight alkyl.

44. The product of claim 22, comprising said UV-curable resin material of (a).

* * * * *